United States Patent [19]

Ito

[11] Patent Number: 4,598,163
[45] Date of Patent: Jul. 1, 1986

[54] PYROELECTRIC DETECTOR

[75] Inventor: Satoru Ito, Nagaokakyo, Japan

[73] Assignee: Murata Manufacturing Co., Ltd., Japan

[21] Appl. No.: 628,915

[22] Filed: Jul. 9, 1984

[30] Foreign Application Priority Data

Jul. 11, 1983 [JP] Japan ................. 58-126430

[51] Int. Cl.$^4$ .......................... H01L 35/00; G01J 5/00; G01J 5/48
[52] U.S. Cl. ..................... 136/213; 374/121; 356/43
[58] Field of Search ................. 136/208–215; 374/120, 121, 161; 250/353, 338–342; 356/43–46

[56] References Cited

U.S. PATENT DOCUMENTS

| 3,153,343 | 10/1964 | Barnes | 136/213 |
| 3,581,092 | 5/1971 | Pearsall | 136/213 |
| 3,773,564 | 11/1973 | Yamaka et al. | 136/213 |
| 3,839,640 | 10/1974 | Rossin | 136/213 |

Primary Examiner—Thomas Wallen
Attorney, Agent, or Firm—Ostrolenk, Faber, Gerb & Soffen

[57] ABSTRACT

A pyroelectric detector comprising a functional portion in which opposed electrodes 111 to 118 are formed on both surfaces of a pyroelectric type substrate 101 and four light receiving electrode portions a, b, c and d are structured by the opposed electrodes 111 to 118. Among the light receiving electrode portions a, b, c and d, the light receiving electrode portions a and c in odd-numbered positions constitute one light receiving electrode group A and the light receiving electrode portions b and d in even-numbered positions constitute the other light receiving electrode group B. The light receiving electrode portions a and c and the light receiving electrode portions b and d are electrically connected alternately and in series, and the light receiving electrode group A and the other light receiving electrode group B are connected to have opposite polarities.

8 Claims, 13 Drawing Figures

CHOPPING FREQUENCY

PYROELECTRIC DETECTOR

BACKGROUND OF THE INVENTION

1. Field of the Invention

The present invention relates to a pyroelectric detector using a pyroelectric material element in which electric charge is generated according to the change in the amount of incident infrared light so that movement, temperature and other conditions of an object such as the human body for example can be detected.

2. Description of the Prior Art

As is well known, the responsivity (Rv) of a pyroelectric detector is represented by the following equation (1).

$$Rv = \eta \frac{\lambda \cdot \omega \cdot A \cdot R}{G} (1 + \omega^2 \tau^2_E)^{-\frac{1}{2}} (1 + \omega^2 \tau^2_T)^{-\frac{1}{2}} \quad (1)$$

$\eta$: emissivity
$\lambda$: pyroelectric coefficient (dPs/dPT)
$\omega$: chopping frequency
A: light receiving area
R: synthesized resistance
G: thermal diffusion constant
$\tau_E$: electric time constant
$\tau_T$: thermal time constant As indicated in the U.S. Pat. No. 3,839,640 and the British Patent Specification No. 1,447,372, a so-called dual element type with series opposite polarity connection in which two light receiving electrode portions are electrically connected in series and in opposite polarities on a pyroelectric material substrate is widely utilized for detection of movement of the human body, and a type having low frequency and high responsivity is preferred.

FIGS. 1 and 2 are schematic views of pyroelectric detectors of the conventional dual element type with series opposite polarity connection.

In FIGS. 1 and 2, the reference character 1 denotes a pyroelectric material substrate formed of a material such as a Pb(Zr, Ti)O3 ceramics, PbTiO3 ceramics or SrBaNb, electrodes 2a and 2b on the light receiving side being formed on one surface thereof and electrodes 3a and 3b being formed on the other surface thereof to be opposed to the electrodes 2a and 2b. In a structure shown in FIG. 1, infrared ray absorbants 5 and 6 are formed on the electrodes 2a and 2b, while in a structure shown in FIG. 2, infrared ray absorbants 5 and 6 are also formed on the electrodes 2a and 2b. Further, in the structure shown in FIG. 1, the electrodes 2a and 2b are connected by a conductor 4, while in the structure shown in FIG. 2, the electrodes 3a and 3b are also connected by a conductor 4. The polarization axis of the pyroelectric material substrate 1 are shown by the arrows. The reference character 7 denotes an FET, a gate 8 of which is connected to the electrode 3a in the structure in FIG. 1, the electrode 3b being connected to a grounding terminal 9. In the structure shown in FIG. 2, the gate 8 of the FET7 is connected to the electrode 2a and the electrode 2b is connected to the grounding terminal 9. The reference character 10 denotes a drain and the reference character 11 denotes a source.

DC voltage is applied from the drain 10 and radiant energy enters either the electrode 2a or the electrode 2b, or both of them successively, causing change of temperature in the pyroelectric substrate 1 with respect to the ambient temperature. Then, electric charge is instantaneously generated in the pyroelectric material substrate 1 due to the pyroelectric effect, and electric current flows in the resistance synthesized by a resistor Rg connected between the electrodes 3a and 3b, a resistor of the pyroelectric material substrate 1 and an input resistor of FET 7, so that voltage according to this synthesized resistance is generated. This voltage is subjected to impedance transformation by a source follower circuit of the FET 7 and is superposed on DC bias voltage in the form of voltage change in both ends of the resistor Rs so that an AC output signal is provided from the source 11.

In the example in FIG. 1, the electrode 3a has the minus (−) polarity with respect to the gate 8; the electrode 2a opposing to the electrode 3a has the plus (+) polarity; the electrode 2b connected to the electrode 2a by the conductor 4 has the minus (−) polarity; and the electrode 3b opposing to the electrode 2b has the plus (+) polarity.

In the example in FIG. 2, the electrode 2a has the minus (−) polarity with respect to the gate 8; the electrode 3a opposing to the electrode 2a has the plus (+) polarity; the electrode 3b connected to the electrode 3a by the conductor 4 has the minus (−) polarity; and the electrode 2b opposing to the electrode 3b has the plus (+) polarity.

Concerning the above described equation (1), the following equation (2) is established in case of $\omega\tau_E \gg 1$ and $\omega\tau_T \gg 1$ because of $G = h\omega_T$, $1/CR = \omega_E$ and $H = AC_p \cdot t$.

$$Rv = \eta \frac{\lambda}{\omega \epsilon_0 \epsilon_r AC_p} = \eta \frac{\lambda}{\omega \cdot C \cdot t \cdot C_p} \quad (2)$$

$\epsilon_0$: vacuum permittivity
$\epsilon_r$: specific inductive capacitance
C: capacitance
t: thickness of a pyroelectric substrate
$C_p$: specific heat Accordingly, a small specific inductive capacitance ($\epsilon_r$) is preferred for a material of the pyroelectric material substrate 1. However, the Pb(Ti, Zr)O3 ceramics, PbTiO3 ceramics or SrBaNb shown as a material of the pyroelectric material substrate 1 has a specific inductive capacitance ($\epsilon_r$) as large as 200 or more and therefore, it is difficult to improve the responsivity (Rv) from a material stand point.

In addition, as seen from the right side of the equation (2), C is preferably as small as possible and since the pyroelectric detector is of the temperature changing type, $C_p$ and t must be small. However, change of $\epsilon_r$, A and t is limited by the characteristics and accordingly, it must be considered to design a detector having a small capacitance C.

Since the detectors shown in FIG. 1 or FIG. 2 are of a dual element type with series opposite polarity connection, the capacitance C between the gate 8 and the grounding terminal 9 is $\frac{1}{2}$ as compared with the capacitance of a single-device type in case where a pair of opposed electrodes are formed on both surfaces of a pyroelectric material substrate. However, the detectors as shown in FIG. 1 or FIG. 2 have problems in that sufficient output cannot be obtained as voltage because the capacitance C is still large and thus charging by pyroelectric current continues too long.

Furthermore, irregularities are sometimes caused in the capacitance of the two devices in a process of formation of electrodes or in the thickness of the infrared ray absorbant in a manufacturing process thereof, resulting in a difference of responsivity between the two devices. As a result, the characteristics of a pyroelectric detector with the series opposite polarity connection type can not be sufficiently utilized as is understood from the facts that:

(1) light coming from outside such as sunlight cannot be sufficiently canceled by two devices, (2) vibrating noises cannot be sufficiently cancelled by two devices, and (3) electric charge generated due to the change in the ambient temperature cannot be sufficiently canceled by two devices.

SUMMARY OF THE INVENTION

Therefore, a primary object of the present invention is to provide a pyroelectric detector in which responsivity, namely specific detectivity, $D^*$ is improved.

Another object of the present invention is to provide a pyroelectric detector having excellent characteristics in resistance to the environmental conditions, in which influences from outside such as mechanical vibrations or change in the ambient temperature can be effectively excluded.

In a wide aspect of the present invention, a pyroelectric detector has a functional portion, which comprises a pyroelectric material substrate and opposed electrodes formed on both surfaces of the pyroelectric material substrate so that the polarization axes of the pyroelectric material substrate are perpendicular to the electrode surfaces, and the opposed electrodes constituting at least four or more and an even number of light receiving electrode portions, the odd-numbered light receiving electrode portions out of all the light receiving electrode portions constituting one light receiving electrode group and the even-numbered light receiving electrode portions constituting the other light receiving electrode group, so that the odd-numbered light receiving electrodes and the even-numbered light receiving electrodes are electrically connected alternately and in series and one light receiving electrode group and the other light receiving electrode group have opposite polarities.

In a specified aspect of the present invention, four or more and an even number of light receiving electrode portions can be disposed along the longitudinal direction of the pyroelectric material substrate. The distance from the odd-numbered light receiving electrode portions to the even-numbered light receiving electrode portions can be selected to be relatively longer than the distance between the adjacent electrode portions in each light receiving electrode group.

Further, in a specified aspect of the present invention, the above described functional portions may be disposed in a plural number along the longitudinal direction of the pyroelectric material substrate or may be disposed in a matrix along the longitudinal and transversal directions of the pyroelectric material substrate.

Since the present invention has the above described structure, it becomes possible to make small the total capacitance of all the devices and accordingly, a pyroelectric detector having improved responsivity, namely specific detectivity, $D^*$ as well as excellent characteristics in resistance to the environmental conditions can be obtained.

DESCRIPTION OF THE EMBODIMENTS

Figure 3:
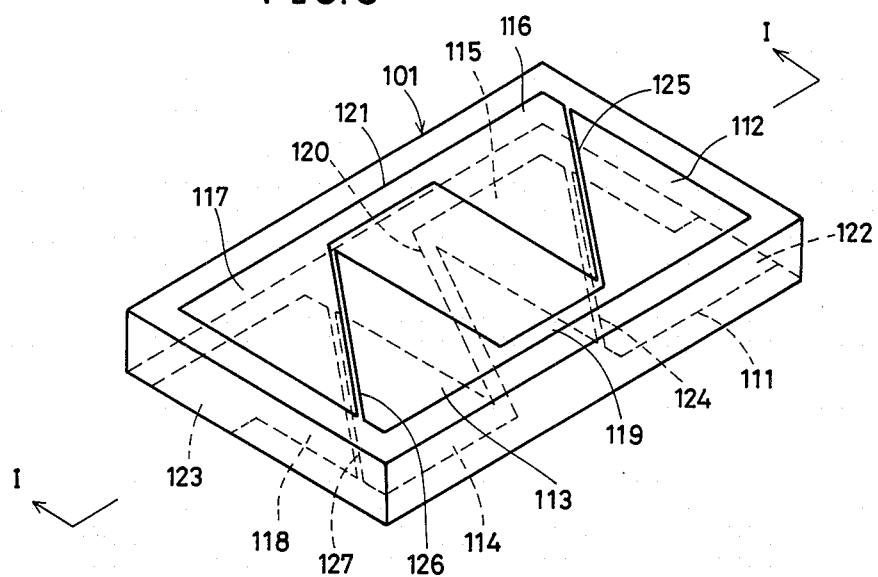
FIG. 3 is a schematic perspective view for explaining the structure of a pyroelectric device unit in accordance with an embodiment of the present invention.
Figure 4:
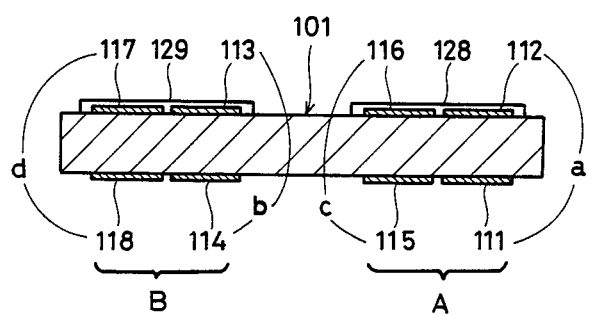
FIG. 4 is a sectional view taken along the line I—I of FIG. 3, showing a state in which infrared ray absorbants are further formed on the structure shown in FIG. 3.
Figure 5:
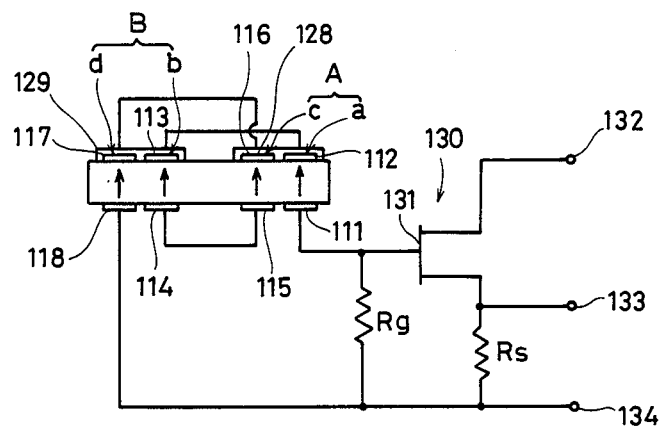
FIG. 5 is a diagram showing connection of the pyroelectric detector shown in FIGS. 3 and 4.
Figure 6:
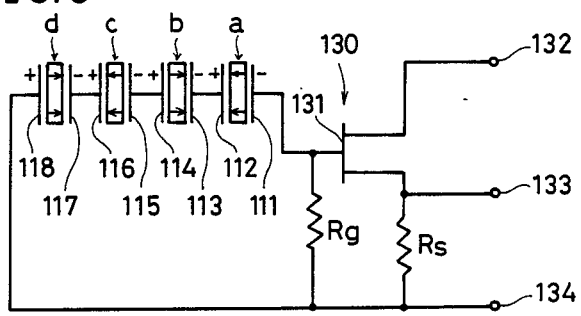
FIG. 6 is a diagram shown in an example of a circuit in the pyroelectric detector of the embodiment shown in FIGS. 3 an 4.
Figure 7:
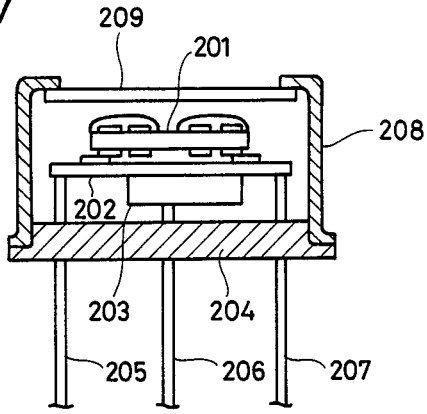
FIG. 7 is a sectional view showing a state in which a pyroelectric device unit in accordance with the embodiment shown in FIGS. 3 and 4 is mounted in a case.

FIGS. 3 to 7 show an embodiment of a pyroelectric detector in accordance with the present invention. FIG. 3 is a perspective view of a pyroelectric device unit to be incorporated in a pyroelectric detector; FIG. 4 is a sectional view taken along the line I—I in FIG. 3; FIGS. 5 and 6 are diagrams of a circuit in a pyroelectric detector; and FIG. 7 is a sectional view of a pyroelectric detector in which the pyroelectric device unit is incorporated.

Referring to the drawings, the reference character 101 denotes a pyroelectric material substrate having one surface on which opposed electrodes 111, 114, 115 and 118 are formed as well as the other surface on which opposed electrodes 112, 113, 116 and 117 are formed. The opposed electrodes 111 to 118 are each in a nearly triangular form. Among these electrodes 111 to 118, the electrodes 111 and 112, the electrodes 113 and 114, the electrodes 115 and 116, and the electrodes 117 and 118 are respectively opposed to each other through the pyroelectric material substrate 101. On one surface of the pyroelectric material substrate 101, that is, on the back surface in the drawings, the electrodes 111 and 115 are separated by a slit 124 and an outline given by combining both electrodes is nearly rectangular. The electrodes 114 and 118 are separated by a slit 127 and an outline given by combining both electrodes is also nearly rectangular. On the other surface in the drawings, the electrodes 112 and 116 are separated by a slit 125 and an outline given by combining them is nearly rectangular, while the electrodes 113 and 117 are separated by a slit 126 and an outline given by combining them is also nearly rectangular. The electrodes 112 and 113 are connected by a conductor path 119, the electrodes 114 and 115 are connected by a conductor path 120 and the electrodes 116 and 117 are connected by a conductor path 121. The reference characters 122 and 123 denote respectively leading electrodes connected to the electrodes 111 and 118, respectively.

In such structure, the opposed electrodes 111 and 112 constitute a light receiving electrode portion a; the opposed electrodes 113 and 114 constitute a light receiving electrode portion b; the opposed electrodes 115 and 116 constitute a light receiving electrode portion c; and the opposed electrodes 117 and 118 constitute a light receiving electrode portion d.

If the light receiving electrode portions a to d are numbered in the order of a, b, c and d, the odd-numbered light receiving electrode portions a and c are disposed as a light receiving electrode group A in one end in the longitudinal direction of the pyroelectric material substrate 101, while the even-numbered light receiving electrode portions b and d are disposed as a light receiving electrode group B in the other end. Thus, the light receiving electrode portions are divided into two groups.

As is clear from the arrangement of electrodes shown in FIGS. 3 and 4, connection of the light receiving electrode portions a to d is made as shown in FIG. 5, whereby the light receiving electrode portions a and c of the light receiving electrode group A and the light receiving electrode portions b and d of the light receiving electrode group B are electrically connected in the order of a, b, c and d. If portions corresponding to the light receiving electrode portions a to d are supposed to be individual pyroelectric device units, connection thereof becomes as shown in FIG. 6. In FIGS. 5 and 6, the arrows shown in the pyroelectric material substrate indicate polarization axes which intersect orthogonally with the opposed electrodes 111 to 118.

Though not shown in FIG. 3, the reference characters 128 and 129 in FIGS. 4 and 5 denote infrared ray absorbants which are formed on the surfaces of the light receiving electrode groups A and B, respectively. More specifically, the infrared ray absorbant 128 is formed in a region including the electrodes 112 and 116 and the infrared ray absorbant 129 is formed in a region including the electrodes 113 and 117. As a material for the infrared ray absorbants 128 and 129, a material having high conductivity such as Ni-Cr is not suited since the opposed electrodes are disposed closely, and therefore, an organic material such as acryl resin or nitrocellulose resin having excellent insulating property is preferred.

In FIGS. 5 and 6, the reference character 130 denotes an FET; the reference character 131 denotes a gate; the reference character 132 denotes a drain; the reference character 133 denotes a source; and the reference character 134 denotes a grounding terminal. The electrode 111 has the minus (−) polarity with respect to the gate 131 of the FET 130. Subsequently, the electrode 112 has the plus (+) polarity; the electrode 113 has the minus (−) polarity; the electrode 114 has the plus (+) polarity; the electrode 115 has the minus (−) polarity; the electrode 116 has the plus (+) polarity; the electrode 117 has the minus (−) polarity; and the electrode 118 has the plus (+) polarity. Accordingly, in the light receiving electrode group A, the opposed electrodes 111 and 115 on the back surface of the pyroelectric material substrate 101 have the minus (−) polarity and the opposed electrodes 112 and 116 on the front surface have the plus (+) polarity. On the other hand, in the light receiving electrode group B, the opposed electrodes 114 and 118 on the back surface of the substrate 101 have the plus (+) polarity and the opposed electrodes 113 and 117 on the front surface have the minus (−) polarity.

Figure 1:
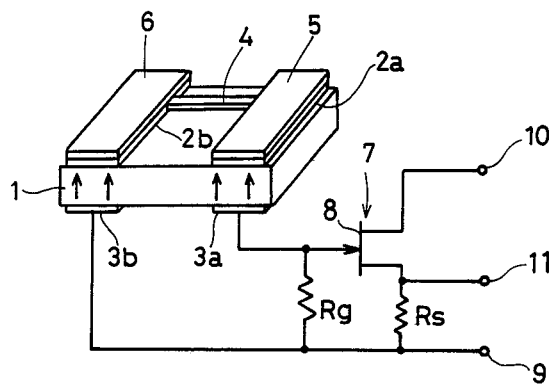
FIG. 1 is a schematic perspective view of an example of a conventional pyroelectric detector of a dual element type with series opposite polarity connection.
Figure 2:
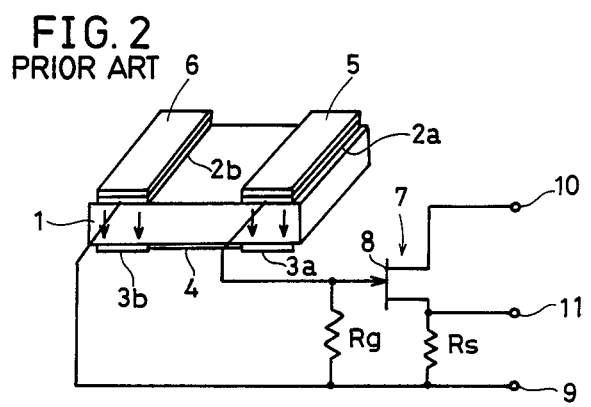
FIG. 2 is a schematic perspective view of another example of a conventional pyroelectric detector.

Accordingly, as is understood from the above described structure, particularly as is clear from FIG. 6, four pyroelectric device units are connected in series and the capacitance becomes $\frac{1}{2}$ as compared with the capacitance of the above described conventional examples shown in FIGS. 1 and 2. Therefore, it can be understood that from the above described equation (2), the responsivity (Rv) can be improved. In addition, irregularity in the capacitance determined by the light receiving electrode portions a to d can be reduced and absorption of infrared rays can be made uniformly, which makes it possible to decrease the difference of responsivity between the light receiving electrode groups A and B and to remarkably improve the characteristics for resisting the environmental conditions such as mechanical vibration, noises due to the change of the ambient temperature, etc. Furthermore, the above described structure, in which infrared ray energy can be easily absorbed in a scattered manner in the divided light receiving electrode groups A and B, is utilized effectively when combined with an optical system such as a multifaced-mirror, lens and the like.

FIG. 7 is a sectional view of a pyroelectric detector in which a pyroelectric device unit of the above described structure including circuits is mounted. In FIG. 7, the reference character 201 denotes a pyroelectric device unit having the above described structure which is fixed on an insulating substrate 202 of ceramics and the like. The reference character 203 denotes an FET which is electrically connected to the pyroelectric device unit 201 so that the circuit as shown in FIGS. 5 and 6 is structured. The insulating substrate 202 to which the pyroelectric device unit 201 and the FET 203 are fixed is connected to pin terminals 205, 206 and 207 protruding from a stem 204. The pin terminals 205, 206 and 207 correspond respectively to the drain 132, the source 133 and the grounding terminal 134 shown in FIGS. 5 and 6. The reference character 208 denotes a cap fixed to the stem 204. In an upper portion of the cap 208, an infrared ray transmitting window 209 is provided.

Now, the embodiment will be described in a specific manner. As a material for the pyroelectric material substrate, a modified material such as $Pb(Sn_{\frac{1}{2}}Sb_{\frac{1}{2}})O_3$-$PbZrO_3$-$PbTiO_3$ as described in Japanese Patent Laying-Opening Gazette No. 20600/1978 was utilized. The characteristics of the material utilized were as follows: permittivity ($\epsilon$)=380, dissipation factor (tan $\delta$)=1.4%, and as figure of merit of pyroelectric material $F_V = \lambda/\epsilon_\gamma cp = 1.95 \times 10^{-11}(c.cm/J)$, $F_D = \lambda/CP\sqrt{\epsilon_r} \tan \delta = 3.21 \times 10^{-8}(c.cm/J)$.

Figure 8:
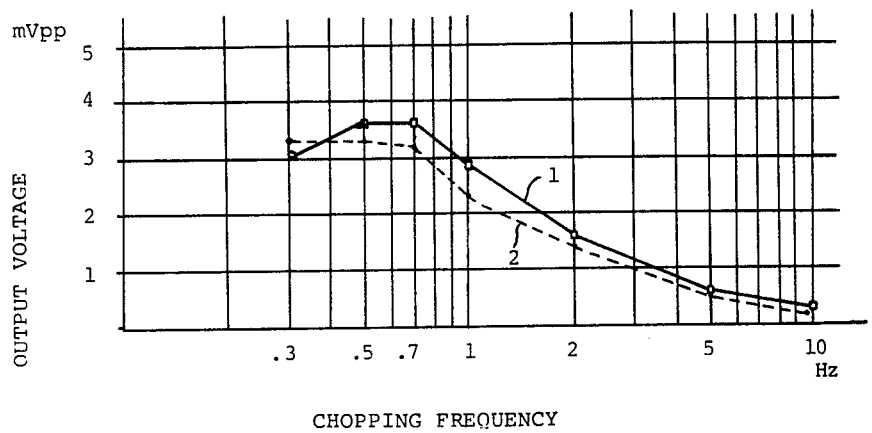
FIG. 8 is a diagram shown in a relation between the chopping frequency and the output voltage in case where the pyroelectric detector shown in FIG. 7 is utilized.

Then, when the chopping frequency was changed with the conditions of the temperature 500° K. (=227° C.) of a black body furnace as a radiant source and the radiant energy 0.87 mW/cm², the output voltage measured at that time was as shown in FIG. 8. In FIG. 8, the line 1 indicates an example of the present invention, and the line 2 indicates a case of a conventional detector, namely a pyroelectric detector shown in FIG. 1. The output voltage is represented by measuring each peak to peak value of the output waveforms.

As seen from FIG. 8, in a detector of the present invention, output voltage is improved by 30% at the chopping frequency of 1 Hz for example as compared with a conventional detector and thus responsivity is improved.

Figure 9:
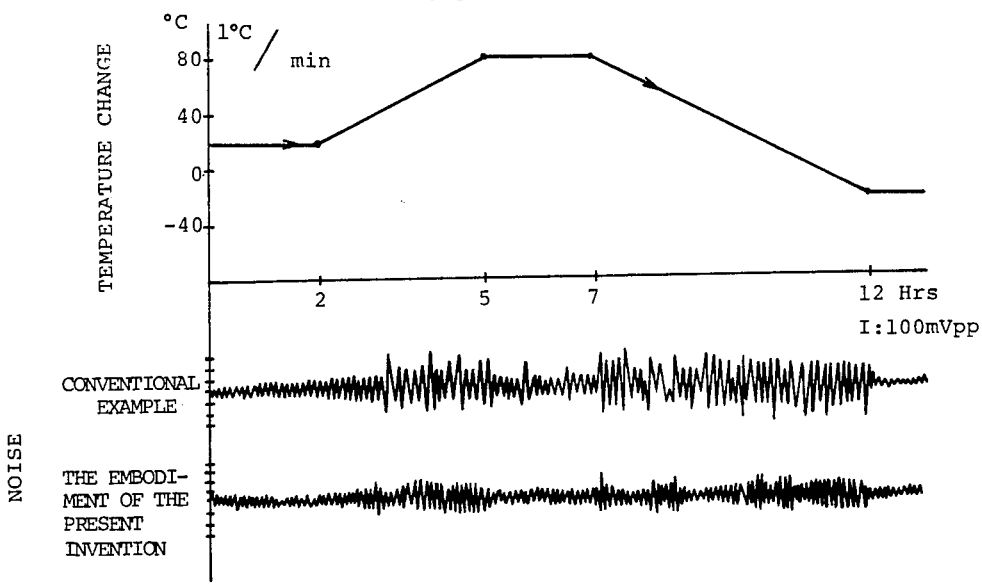
FIG. 9 is a diagram showing a state of noise with respect to the change in the ambient temperature in case where the pyroelectric detector shown in FIG. 7 is utilized.

As to the environment resisting characteristics, noises caused by change in the ambient temperature were measured. FIG. 9 shows the results of the measurement. In a detector of the present invention, noise voltage at the time of rise or lowering of the temperature can be suppressed more effectively as compared with a conventional detector.

Furthermore, it was ascertained that in a pyroelectric detector in accordance with the present invention, the mechanical vibration resisting characteristic is improved as well since noise can be reduced by 20% as compared with a conventional detector, with the conditions of the frequency 20 Hz, 1.2 G and the amplitude of 1.5 mm.

Figure 10:
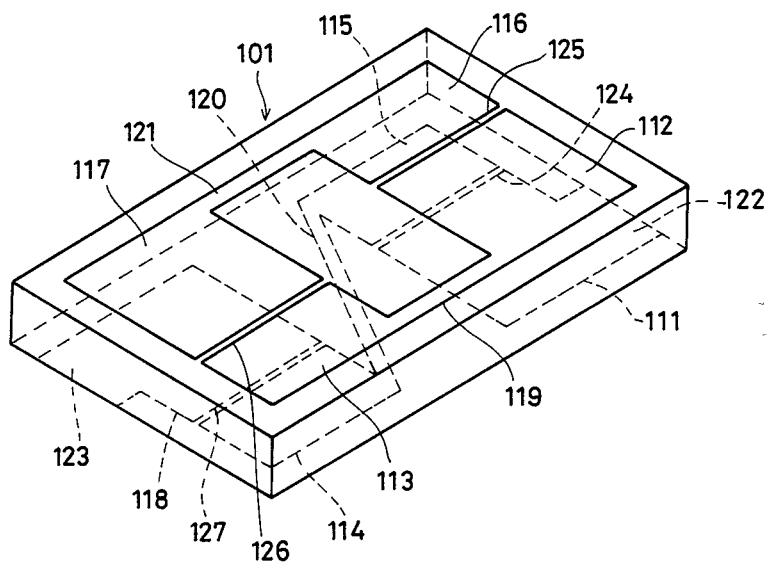
FIG. 10 is a perspective view corresponding to FIG. 3 for explaining another embodiment of the present invention.
Figure 11:
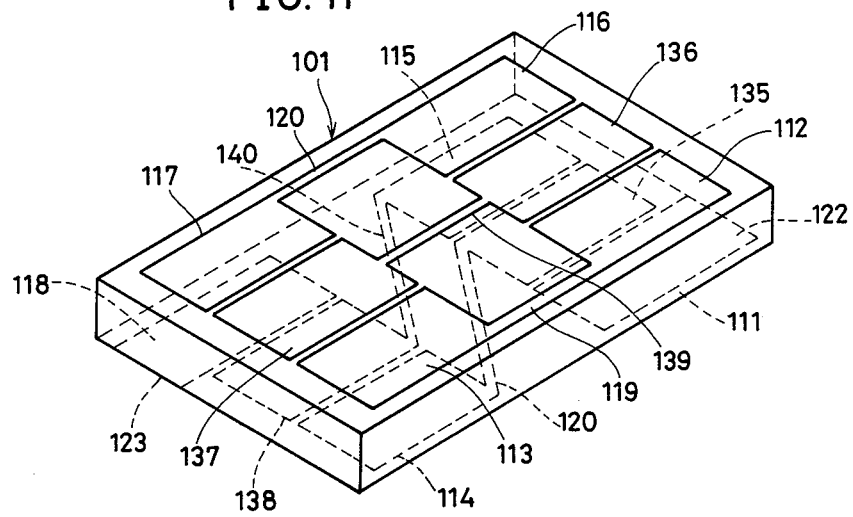
FIG. 11 is a perspective view corresponding to FIG. 3 for explaining a further embodiment of the present invention.

FIGS. 10 and 11 are perspective view showing other embodiments of a pyroelectric detector in accordance with the present invention. In these detectors particularly, the form and the arrangement of the opposed electrodes are changed. Accordingly, the following description will be given by emphasizing this point.

In FIGS. 10 and 11, the same portions as shown in FIGS. 3 and 4 are denoted by the same reference characters. The detector shown in FIG. 10 is characterized in that the electrodes 111 to 118 are respectively in a rectangular form. Accordingly, except for this point, the detector in FIG. 10 has the same structure as in the previously described embodiment, in which four light receiving electrode portions are structured, the odd-numbered light receiving electrode portions constituting one light receiving electrode group and the even-numbered light receiving electrode portions constituting the other light receiving electrode group, so that the light receiving electrode portions of the group in the odd-numbered positions and the light receiving electrode portions of the group in the even-numbered positions are electrically connected alternately and in series.

In the detector shown in FIG. 11, opposed electrodes of a rectangular form as in FIG. 10 are increased in number and each light receiving electrode group contains three light receiving electrode portions. More specifically, the electrodes 136 and 137 are formed on one surface of the pyroelectric material substrate 101 and the electrodes 135 and 138 are formed on the other surface. The electrode 135 is connected to the electrode 114 through a conductor path 120, the electrode 136 is connected to the electrode 137 through a conductor path 139, and the electrode 138 is connected to the electrode 115 through a conductor path 140. As is clear from the state shown in the drawings, the electrodes 135 and 136 are opposed to each other through the pyroelectric material substrate 101 and the electrodes 137 and 138 are opposed to each other through the pyroelectric substrate 101. In this embodiment, the capacitance can be reduced to ⅓ of the capacitance as shown in FIGS. 1 and 2 and the environment resisting characteristics as well as responsivity and specific detectivity, $D^*$ can be improved. It may be added that as described above with regard to the embodiment of FIG. 10, this embodiment also satisfies the necessary conditions for constituting the structure as indicated in the embodiment in FIGS. 3 to 7.

Figure 12:
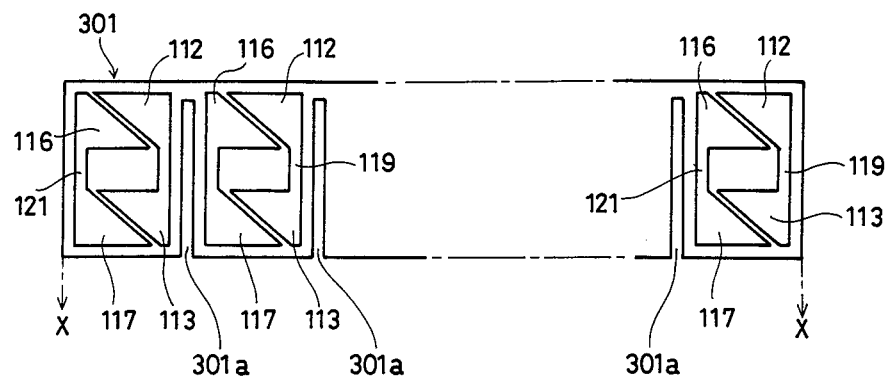
FIG. 12 is a schematic plane view for explaining a pyroelectric device unit for use in still a further embodiment.

FIG. 12 is a schematic plane view for explaining a still further embodiment of the present invention. As can be seen from FIG. 12, in this embodiment, a plurality of functional portions are disposed on a pyroelectric material substrate 301 along the longitudinal direction of the pyroelectric material substrate 301. These functional portions are structured in the same manner as in the embodiment shown in FIG. 3 and therefore, the description thereof is omitted by attaching the same reference characters thereto as in FIG. 3. Thus, a pyroelectric detector of the present invention may comprise a plurality of functional portions. In FIG. 12, a slit 301a is provided between the respective functional portions of the pyroelectric material substrate 301. The slit 301a serves to prevent heat from being transmitted between the functional portions.

Although in the structure shown in FIG. 12, the functional portions are disposed in the longitudinal direction of the pyroelectric material substrate 301 in a state as shown in the drawing, it goes without saying that the functional portions are disposed in the longitudinal direction of the pyroelectric material substrate 301 in a state in which the functional portions are rotated by 90° from the state shown in the drawing. In addition, the pyroelectric material substrate 301 may be extended to the direction shown by the chain lines X in FIG. 12 so that the functional portions may be disposed in a matrix in the longitudinal and transversal directions of the pyroelectric material substrate 301.

Figure 13:
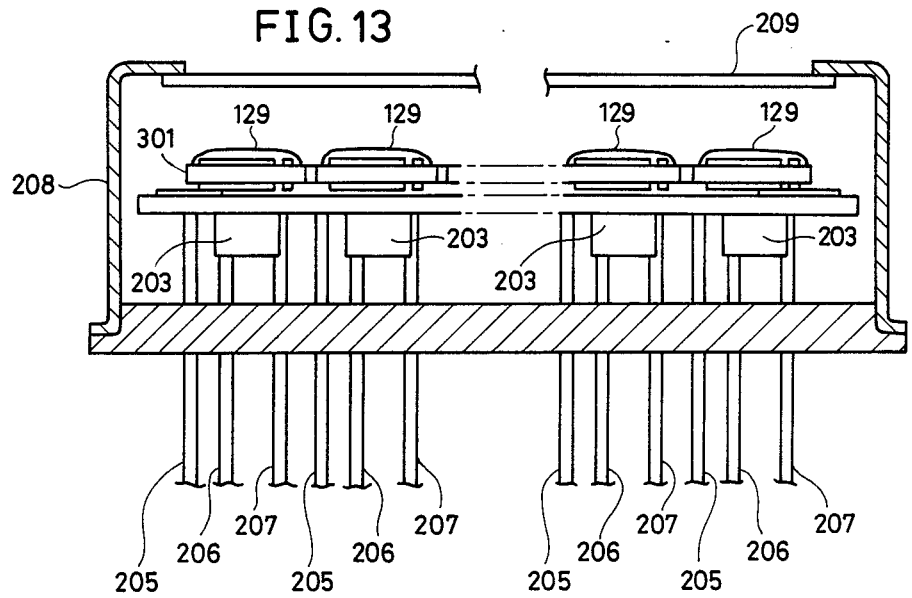
FIG. 13 is a sectional view showing a pyroelectric detector in which a pyroelectric device unit shown in FIG. 11 is incorporated.

FIG. 13 is a sectional view of a pyroelectric detector in which the pyroelectric device unit shown in FIG. 12 is incorporated. Accordingly, the corresponding portions are denoted by the corresponding reference characters, the description thereof being omitted. As is clear from FIG. 13, in this embodiment, the functional portions are incorporated as a single body, but are respectively structured independently. Specifically, the outputs from the functional portions are obtained separately from the pin terminals 205 to 207 respectively connected thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pyroelectric detector having a functional portion comprising;
    a pyroelectric material substrate (101) and
    opposed electrodes (111 to 118) formed on both surfaces of said substrate (101) so that the polarization axes of said pyroelectric material substrate (101) are perpendicular to the surfaces of said electrodes,
    said opposed electrodes constituting,, at least four or more and an even number of light receiving electrode portions (a, b, c and d),
    the odd-numbered light receiving electrode portions (a and c) out of said light receiving electrode portions being classified as one light receiving electrode group A and the even-numbered light receiving electrode portions (b and d) being classified as the other light receiving electrode group B,
    said odd-numbered light receiving electrode portions (a and c) and said even-numbered light receiving electrode portions (b and d) being electrically connected alternately and in series so that said light receiving electrode group A and said other light receiving electrode group B are of opposite polarities.

2. A pyroelectric detector in accordance with claim 1, wherein the odd-numbered light receiving electrode portions (a and c) constituting said light receiving electrode group A and the even-numbered light receiving electrode portions (b and d) constituting said light receiving electrode group B are disposed to be separated by a relatively longer distance than the distance between the adjacent electrode portions in each of said electrode groups A and B.

3. A pyroelectric detector in accordance with claim 2, wherein said light receiving electrode portions (a, b, c and d) are formed to be four in number, the first and the third light receiving electrode portions (a and c) are disposed on the side of one end in the longitudinal direction of said pyroelectric material substrate (101) and the second and the fourth light receiving electrode portions (b and d) are disposed on the side of the other end.

4. A pyroelectric detector in accordance with claim 3, wherein said opposed electrodes (111 to 118) constituting said light receiving electrode portions have respectively a nearly triangular form, and the opposed electrodes constituting said first light receiving portion (a) and said third light receiving electrode portion (c) are disposed closely so that an outline given by combining respective two electrodes on either surface of said substrate is nearly rectangular.

5. A pyroelectric detector in accordance with claim 3, wherein the opposed electrodes constituting said respective light receiving electrode portions (a, b, c and d) have respectively a nearly rectangular form.

6. A pyroelectric detector in accordance with claim 1, wherein said light receiving electrode group A comprises three light receiving electrode portions formed on the side of one end in the longitudinal direction of said pyroelectric material substrate and said other light receiving electrode group B comprises three light receiving electrode portions formed on the side of the other end in the longitudinal direction of said pyroelectric material substrate.

7. A pyroelectric detector in accordance with claim 1, wherein said functional portions are disposed in a plural number along the longitudinal direction of said pyroelectric material substrate (301).

8. A pyroelectric detector in accordance with claim 1, wherein said functional portions are disposed in a matrix along the longitudinal and transversal directions of said pyroelectric material substrate (301).

* * * * *